United States Patent [19]

Roberts

[11] Patent Number: 5,770,496

[45] Date of Patent: *Jun. 23, 1998

[54] METHOD OF MAKING A RESISTOR

[75] Inventor: Martin Ceredig Roberts, Boise, Id.

[73] Assignee: Micron Technology, Inc., Boise, Id.

[*] Notice: The term of this patent shall not extend beyond the expiration date of Pat. No. 5,635,418.

[21] Appl. No.: 788,617

[22] Filed: Jan. 24, 1997

Related U.S. Application Data

[63] Continuation of Ser. No. 409,505, Mar. 23, 1995, Pat. No. 5,635,418.

[51] Int. Cl.$^6$ .................................................. H01L 27/02
[52] U.S. Cl. .......................................... 438/238; 438/382
[58] Field of Search ........................... 438/564, 554–556, 438/382, 381, 238

[56] References Cited

U.S. PATENT DOCUMENTS

| 3,134,912 | 5/1964 | Evans | 257/904 |
| 5,177,030 | 1/1993 | Lee et al. | 437/47 |
| 5,316,978 | 5/1994 | Boyd et al. | 438/382 |
| 5,385,858 | 1/1995 | Manabe | 437/52 |

Primary Examiner—Jey Tsai
Attorney, Agent, or Firm—Wells, St. John, Roberts, Gregory & Matkin, P.S.

[57] ABSTRACT

A semiconductor processing method of forming a resistor from semiconductive material includes: a) providing a node to which electrical connection to a resistor is to be made; b) providing a first electrically insulative material outwardly of the node; c) providing an exposed vertical sidewall in the first electrically insulative material outwardly of the node; d) providing a second electrically insulative material outwardly of the first material and over the first material vertical sidewall, the first and second materials being selectively etchable relative to one another; e) anisotropically etching the second material selectively relative to the first material to form a substantially vertically extending sidewall spacer over the first material vertical sidewall and to outwardly expose the first material adjacent the sidewall spacer, the spacer having an inner surface and an outer surface; f) etching the first material selectively relative to the second material to outwardly expose at least a portion of the spacer outer surface; g) providing a conformal layer of a semiconductive material over the exposed outer spacer surface and over the inner spacer surface, the conformal layer making electrical connection with the node; and h) patterning the conformal layer into a desired resistor shape. SRAM and other integrated circuitry incorporating this and other resistors is disclosed.

19 Claims, 6 Drawing Sheets

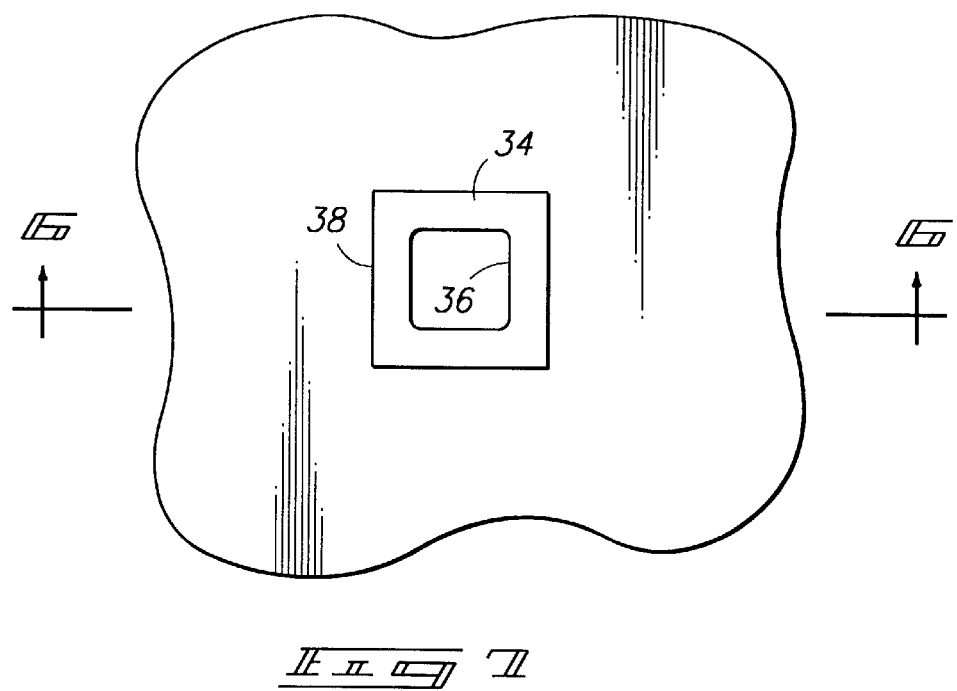
_Fig. 7_
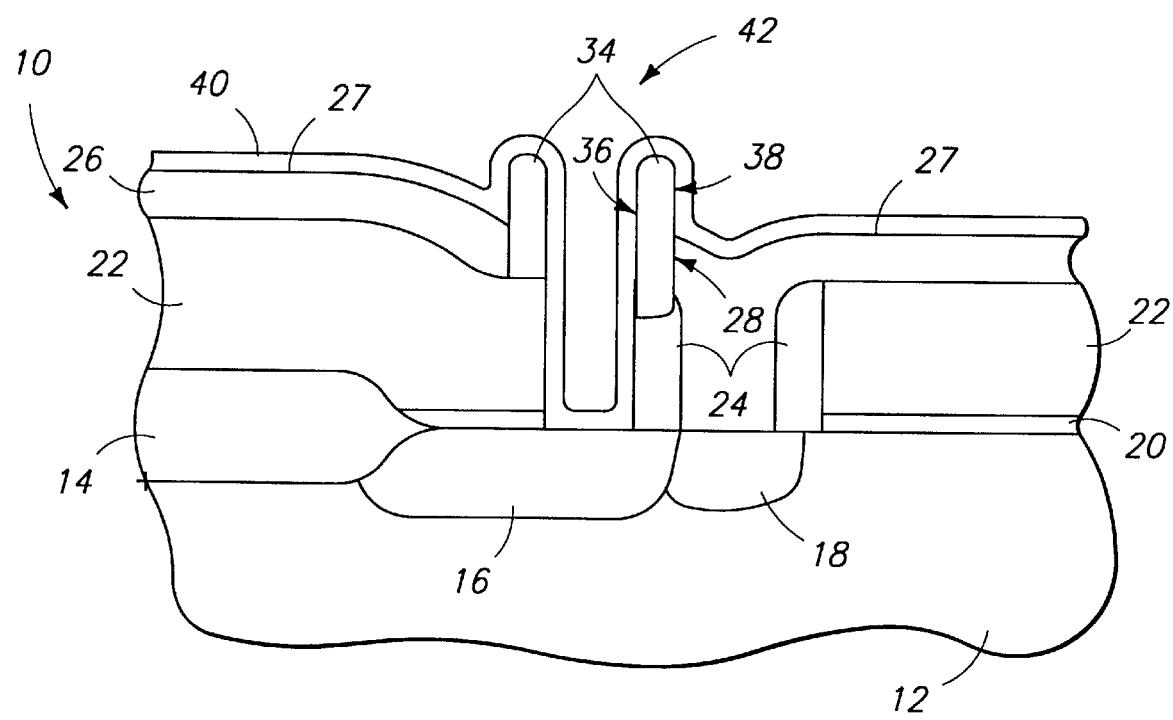
_Fig. 8_

5,770,496

METHOD OF MAKING A RESISTOR

RELATED PATENT DATA

This patent resulted from a continuation application of U.S. application Ser. No. 08/409,505, filed on Mar. 23, 1995, now U.S. Pat. No. 5,635,418 entitled "A Method Of Making A Resistor" listing the inventor as Martin Ceredig Roberts.

TECHNICAL FIELD

This invention relates generally to semiconductor processing methods of forming resistors from semiconductive material, and to static random access memory (SRAM) cells incorporating resistors, and to other integrated circuitry incorporating resistors.

BACKGROUND OF THE INVENTION

One of the common elements required in electrical circuit devices is the pull-up or pull-down device from an active device to one of the power supply buses, typically referred to as Vcc. The pull-up is simple if used to construct a circuit using discrete components in that all that is required is selecting a resistor of the desired resistance and tolerance, connecting it between an active device such as an open collector transistor and Vcc, and the transistor's output would be pulled up to Vcc once the transistor is forward biased. With the advent of the integrated circuitry, however, fabricating a resistance onto a wafer substrate, such as silicon or gallium arsenide, takes special consideration, particularly when resistivity and tolerances play an important part in circuit operation.

For example, as SRAMs have evolved from the 4 Kb memory arrays to more densely packed array sizes, tolerances of pull-up resistances had to be tightly controlled. In order to minimize standby current, many fabrication processes adopted use an active device as the pull-up. In CMOS fabrication, it is common to see a PMOS transistor acting as the current path between a memory cell access transistor and the power supply bus. In this manner, the PMOS transistor can be gated "on" only when the desired line is to be pulled up to Vcc and turned off otherwise. This in essence eliminated leakage current and minimizes standby current for the SRAM device as a whole.

The main drawback to using an active device for a pull-up device is the amount of space required to fabricate the device. Now that the SRAM generation has grown to the 1 Mb array size, die space is a critical factor to consider. Technology has basically pushed all types of integrated circuits to be more densely packed, and pull-ups are a common element in many circuit designs.

BRIEF DESCRIPTION OF THE DRAWINGS

Preferred embodiments of the invention are described below with reference to the following accompanying drawings.

FIG. 7 is a diagrammatic top view of FIG. 6.

FIG. 8 is a view of the FIG. 1 wafer fragment at a processing step subsequent to that shown by FIG. 6.

DETAILED DESCRIPTION OF THE PREFERRED EMBODIMENTS

Figure 1:
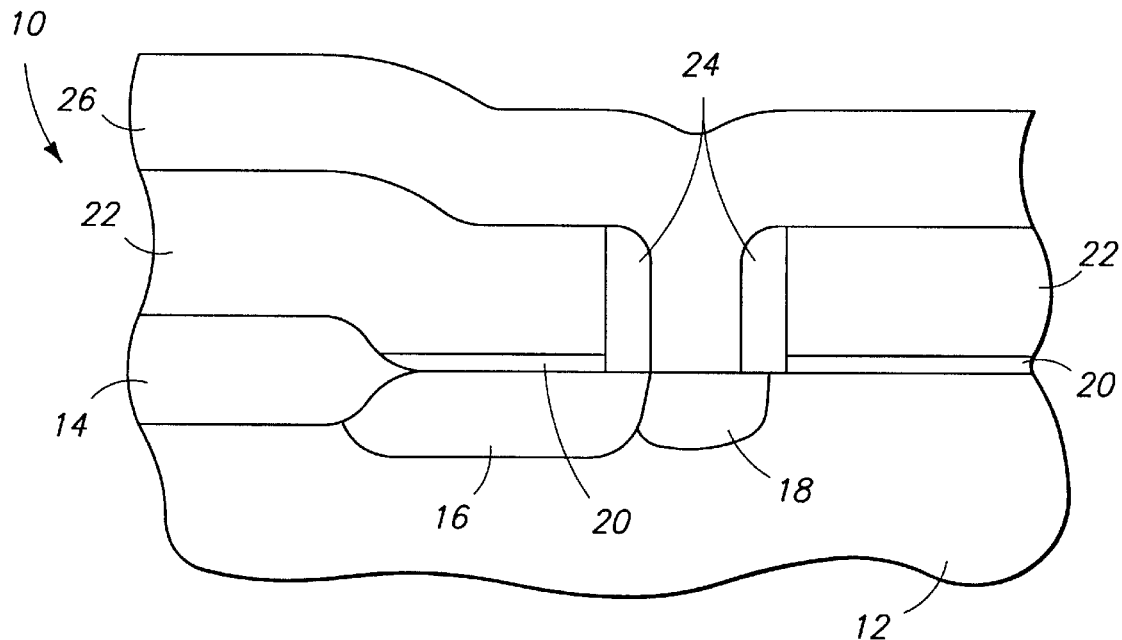
FIG. 1 is a diagrammatic cross-sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a resistor from semiconductive material comprises the following steps:

providing a node to which electrical connection to a resistor is to be made;

providing a first electrically insulative material outwardly of the node;

providing an exposed vertical sidewall in the first electrically insulative material outwardly of the node;

providing a second electrically insulative material outwardly of the first material and over the first material vertical sidewall, the first and second materials being selectively etchable relative to one another;

anisotropically etching the second material selectively relative to the first material to form a substantially vertically extending sidewall spacer over the first material vertical sidewall and to outwardly expose the first material adjacent the sidewall spacer, the spacer having an inner surface and an outer surface;

etching the first material selectively relative to the second material to outwardly expose at least a portion of the spacer outer surface;

providing a conformal layer of a semiconductive material over the exposed outer spacer surface and over the inner spacer surface, the conformal layer making electrical connection with the node; and patterning the conformal layer into a desired resistor shape.

In accordance with another aspect of the invention, an integrated circuit comprises:

a first electrically insulating material layer having an outer surface;

an electrically insulative pillar extending substantially vertically outward of the first layer, the pillar having opposing substantially vertical side surfaces;

an elongated resistor, the resistor comprising a layer of semiconductive material which serpentines over the first layer outer surface and the pillar vertical surfaces;

an electrically conductive first node in electrical connection with the resistor on one side of the insulative pillar; and an electrically conductive second node in electrical connection with the resistor on the other side of the insulative pillar.

In accordance with yet another aspect of the invention, an SRAM cell comprises:

a first pull down transistor having a gate, a source and a drain;

a second pull down transistor having a gate, a source and a drain;

the gate of the first pull down transistor being electrically coupled to the drain of the second pull down transistor;

the gate of the second pull down transistor being electrically coupled to the drain of the first pull down transistor;

a Vcc node;

a first resistor electrically coupled with the Vcc node;

a second resistor electrically coupled with the Vcc node;

the drain of the first pull down transistor being electrically coupled through the first resistor to the Vcc node;

the drain of the second pull down transistor being electrically coupled through the second resistor to the Vcc node; and at least one of the first and second resistors comprising:

a first electrically insulating material layer having an outer surface;

an insulative pillar ring extending substantially vertically outward of the first layer, the pillar ring having opposing inner and outer substantially vertical side surfaces;

an elongated resistor, the resistor comprising a layer of semiconductive material which serpentines over the first layer outer surface and the pillar ring vertical surfaces to form a container shape resistor within the pillar ring;

an electrically conductive first node in electrical connection with the resistor on the inside of the insulative pillar ring; and an electrically conductive second node in electrical connection with the resistor on the outside of the insulative pillar ring.

These and other aspects of the invention will be more readily appreciated by the following description of a preferred embodiment in connection with the accompanying drawings.

Referring initially to FIG. 1, a semiconductor wafer fragment in process is indicated generally with reference numeral 10. Such comprises a bulk substrate 12 and isolation field oxide region 14. Active area implants 16 and 18 are provided within bulk substrate, and in the preferred embodiment constitute drain and source implants of an SRAM cell. Typically and preferably, implant regions 16 and 18 would be n+ doped to, for example, $1\times10^{19}$ or greater ions/cm$^3$. For purposes of the continuing discussion, implant region 16 constitutes a node to which electrical connection to a resistor is to be made.

A gate oxide layer 20 and overlying patterned polysilicon pull-down transistor gate layer 22 are provided. Polysilicon layer 22 is conductively doped with n-type dopant material to an example and preferred concentration of $10^{20}$ ions/cm$^3$. Electrically insulative oxide spacers 24 are provided about the edges of patterned gate or interconnect layer 22, as shown. A first electrically insulative material layer 26 is provided outwardly of patterned gate layer 22, and correspondingly outwardly of node 16. An example and preferred material for layer 26 is undoped SiO$_2$. A design goal in the described preferred embodiment is to provide electrical connection from and between interconnect layer 22 and node 16 through a resistor to a Vcc node.

Figure 2:
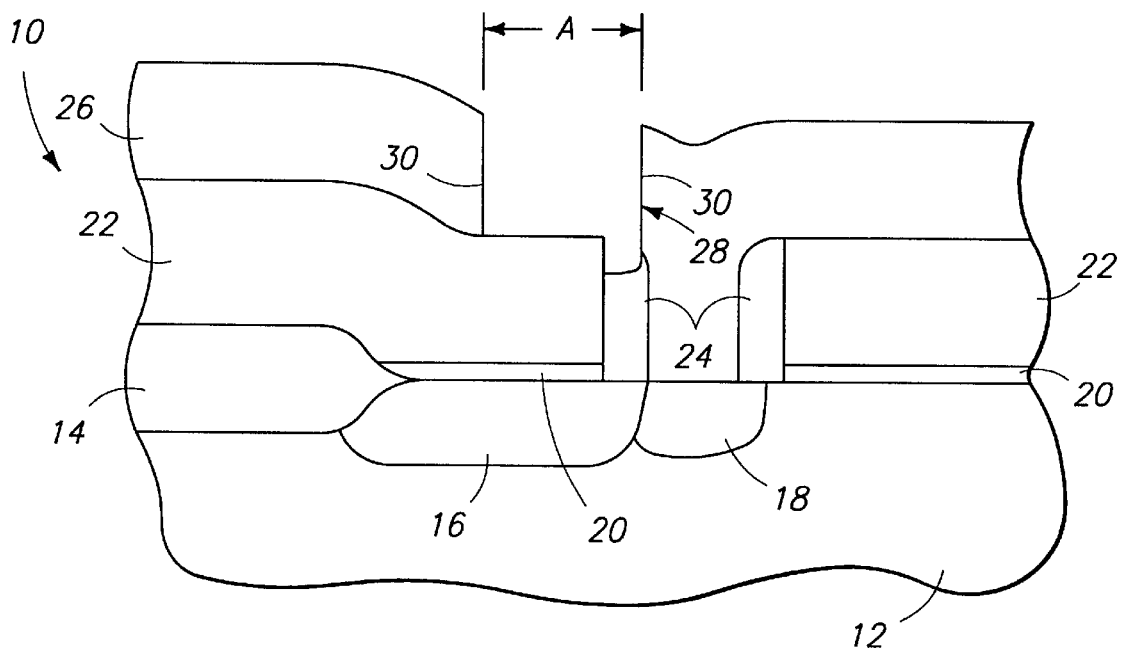
FIG. 2 is a view of the FIG. 1 wafer fragment at a processing step subsequent to that shown by FIG. 1.

Referring to FIG. 2, an opening 28 is provided in first electrically insulative material layer 26 over node 16. Opening 28 comprises sidewalls 30 and an open width or open cross dimension "A". Sidewalls 30 constitute exposed vertical sidewalls in first electrically insulative material 26. In the preferred embodiment, opening 28 stops on polysilicon layer 22 and accordingly at this point in the process does not outwardly expose node 16.

Figure 3:
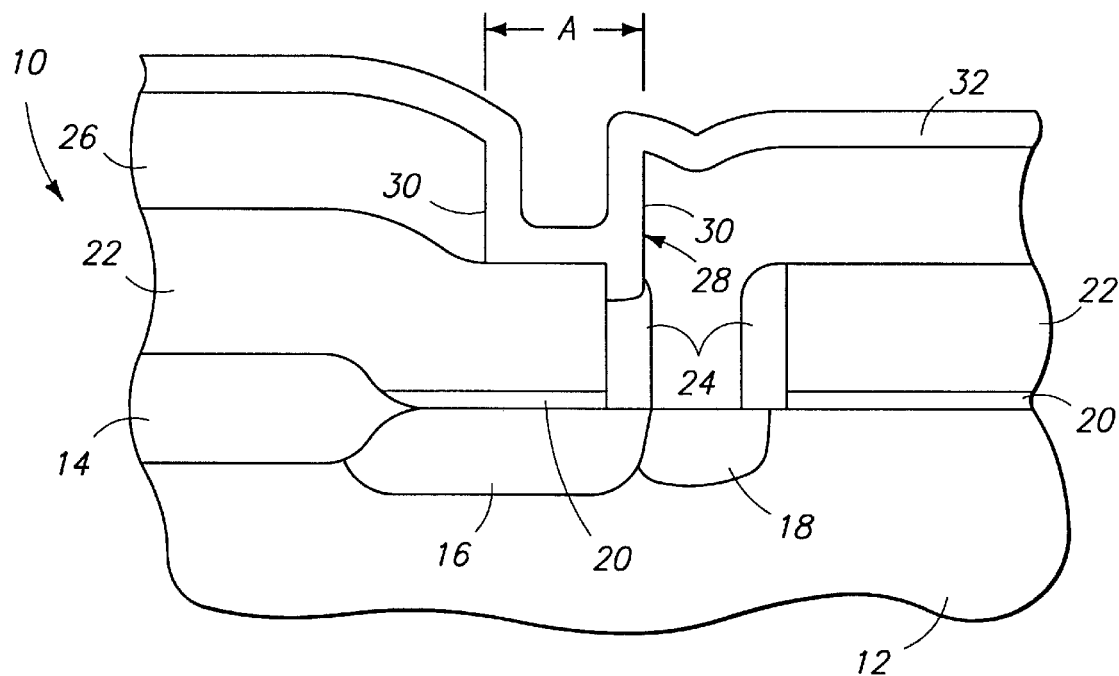
FIG. 3 is a view of the FIG. 1 wafer fragment at a processing step subsequent to that shown by FIG. 2.

Referring to FIG. 3, a second electrically insulative material layer 32 is provided outwardly of first material layer 26 and within opening 28 to a thickness which is less than one-half opening width "A" to less than completely fill such opening with second electrically insulative material. The first and second electrically insulative materials are selected to be selectively etchable relative to one another, with a preferred material for layer 32 being Si$_3$N$_4$ where layer 26 comprises undoped SiO$_2$.

Figure 4:
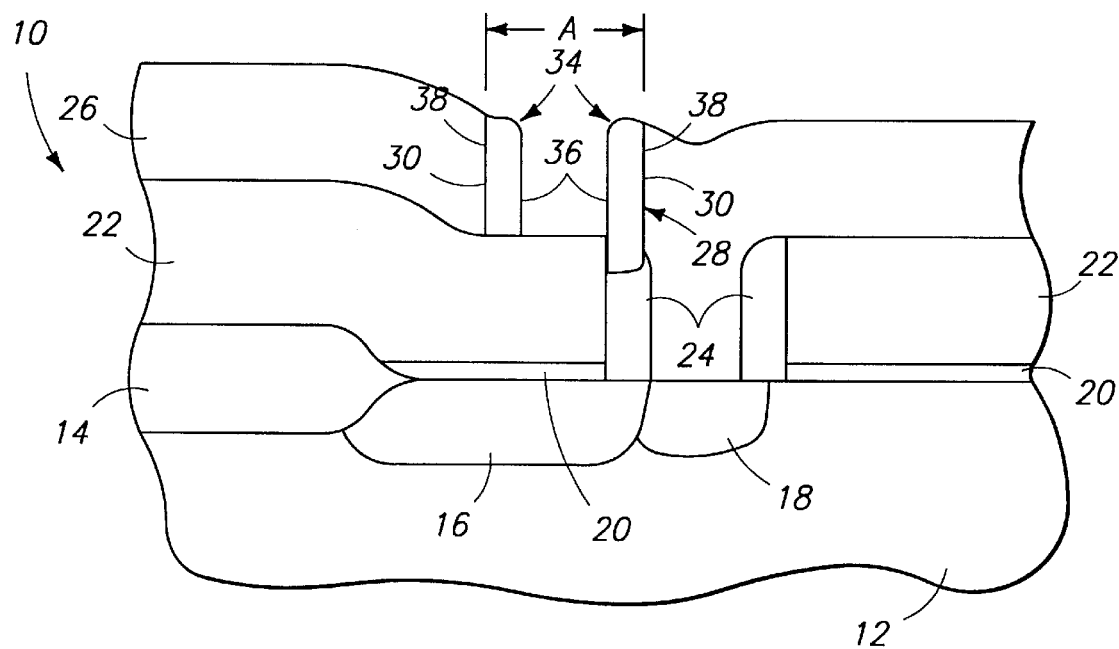
FIG. 4 is a view of the FIG. 1 wafer fragment at a processing step subsequent to that shown by FIG. 3.

Referring to FIG. 4, second material layer 32 is anisotropically etched selectively relative to first material layer 26 to form a substantially vertically extending sidewall ring or spacer 34 within opening 28. This also outwardly exposes first material layer 26 adjacent the sidewall ring or spacer 34. For purposes of the continuing discussion, ring or spacer 34 comprises an inner surface 36 and an outer surface 38.

Figure 5:
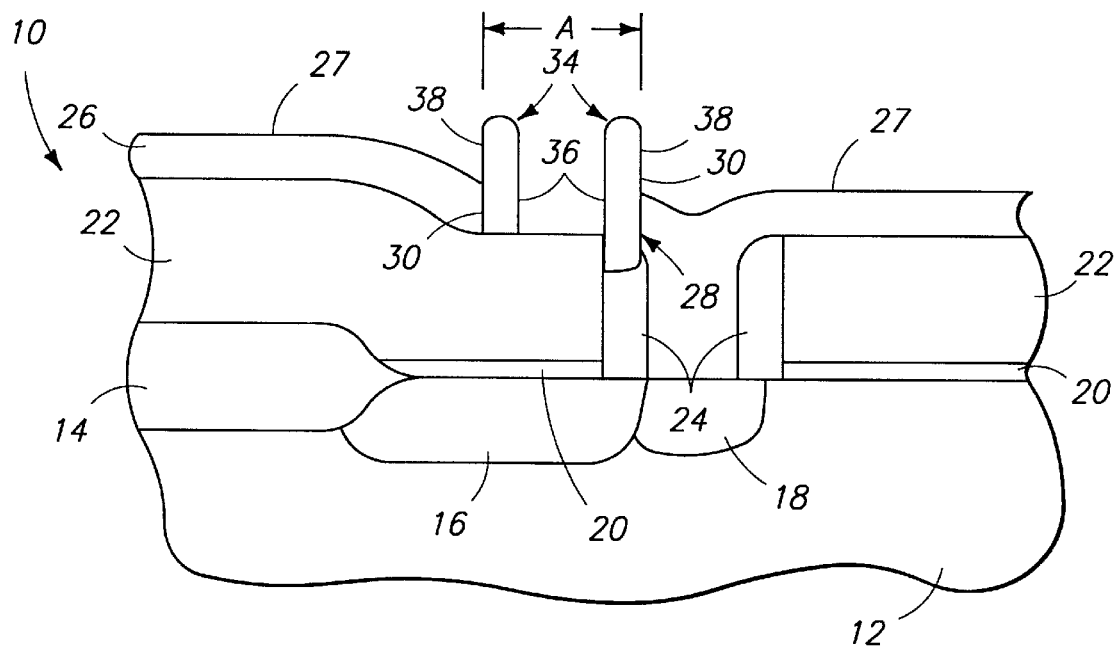
FIG. 5 is a view of the FIG. 1 wafer fragment at a processing step subsequent to that shown by FIG. 4.

Referring to FIG. 5, first material 26 is etched selectively relative to second material 32 to outwardly expose at least a portion of ring outer surface 38, and to provide an exposed outer surface 27 of first layer 26. Ring or spacer 34 effectively constitutes an electrically insulative pillar which extends substantially vertically outward of electrically insulative first layer 26.

Figure 6:
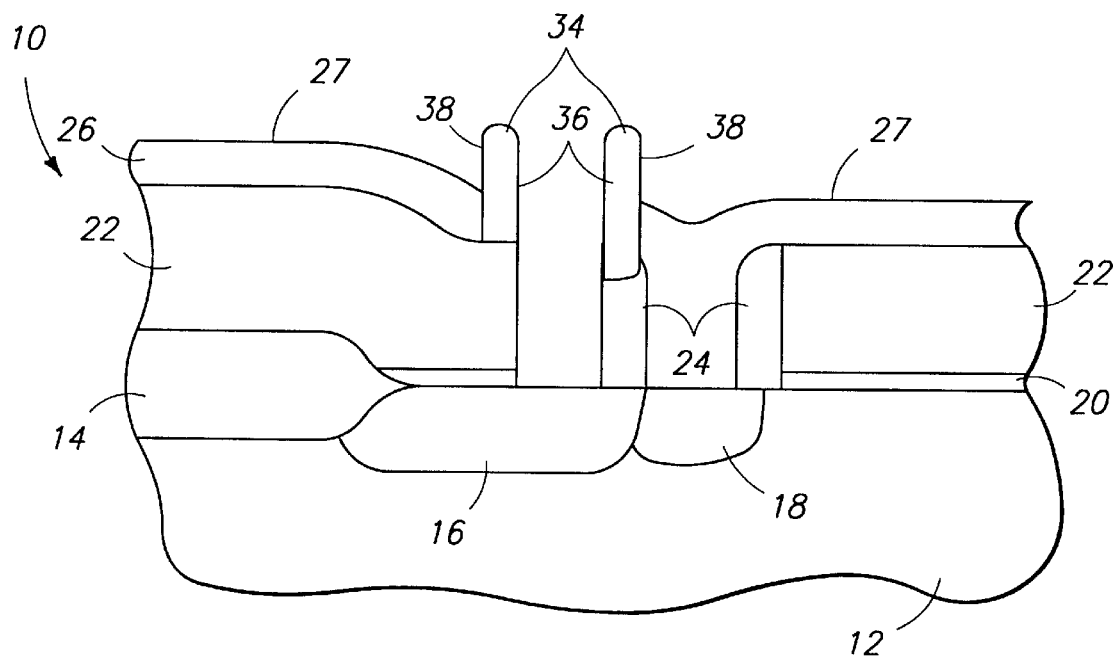
FIG. 6 is a view of the FIG. 1 wafer fragment at a processing step subsequent to that shown by FIG. 5.

FIG. 6 illustrates an etch of poly layer 22 and subsequently gate oxide layer 20 to outwardly expose node 16. FIG. 7 is a top view of FIG. 6, showing the outline of spacer or ring 34.

Referring to FIG. 8, a conformal layer 40 of a semiconductive material is provided over exposed outer ring surface 38 and over inner ring surface 36 within opening 28 to define a container shape 42 of semiconductive material within opening 28. An example and preferred material for layer 40 is polysilicon doped with p-type material to a concentration of $10^{17}$–$10^{18}$ ions/cm$^3$. Container shape 42 contacts, and accordingly makes electrical connection with, node 16 within opening 28.

Figure 9:
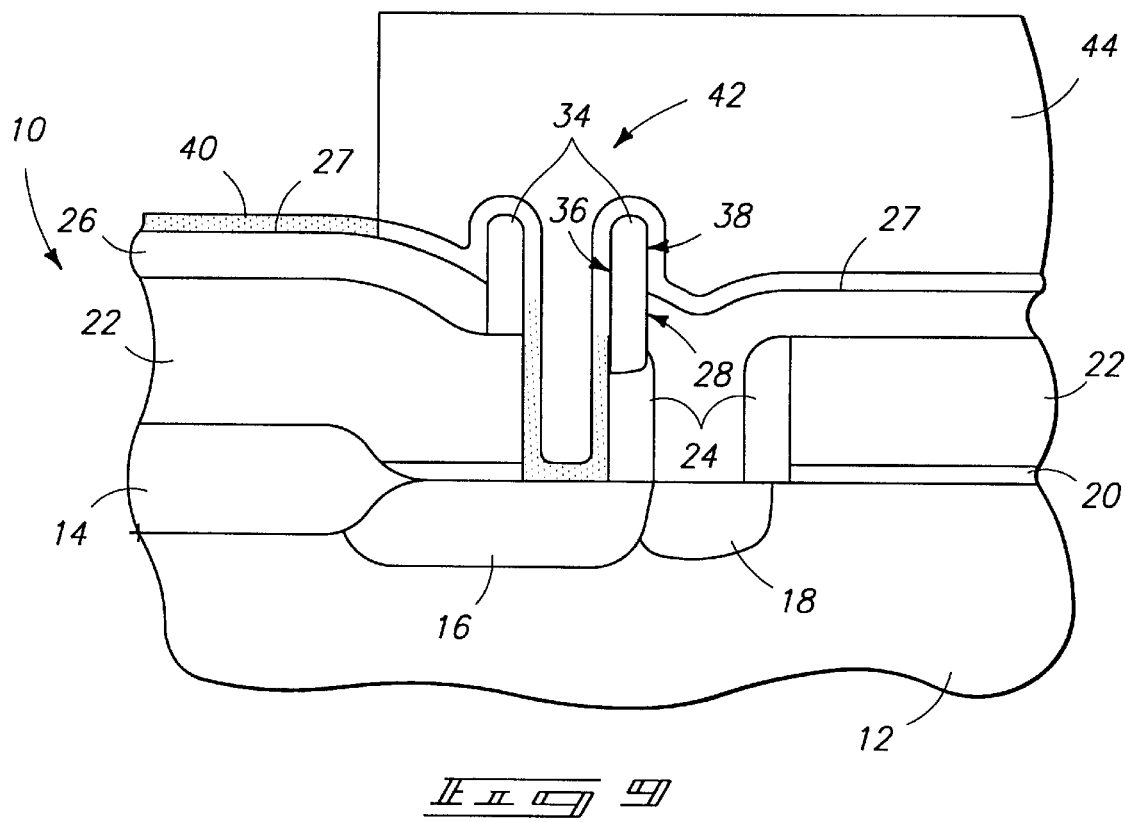
FIG. 9 is a view of the FIG. 1 wafer fragment at a processing step subsequent to that shown by FIG. 8.

Referring to FIG. 9, a photoresist masking layer 44 is provided to mask container portion 42 of conformal layer 40. With mask 44 in place, unmasked exposed portions of layer 40 are conductively doped to a concentration of at least $1\times10^{19}$ ions/cm$^3$ with n-type dopant material. Inherent wafer processing results in sufficient temperatures to cause n-type dopant material from polysilicon gate or interconnect layer 22 to out diffuse into the illustrated lower or inner portion of container 42. Thus in the preferred embodiment, the lower or inner portion of the illustrated container 42 is conductively doped to a higher is conductivity doping concentration than the upper or outer p– doped region of container 42. Thus in the preferred embodiment, different conductivity dopant concentrations are provided at different locations relative to semiconductor resistor layer 40.

For example, the two illustrated heavily n-type doped regions constitute highly conductive material, wherein the intervening undoped region constitutes a low conductance and therefore high resistance area, thereby forming two back-to-back diodes in the polysilicon layer. The reverse bias diodes form a high resistive load. The n+ doped lower portion of container 42 electrically connects with node 16 on the inside of the insulative pillar ring. Likewise, the n+ doped region created by the masking and doping electrically connects with another electrically conductive node on the outside of the insulative pillar ring.

Figure 10:
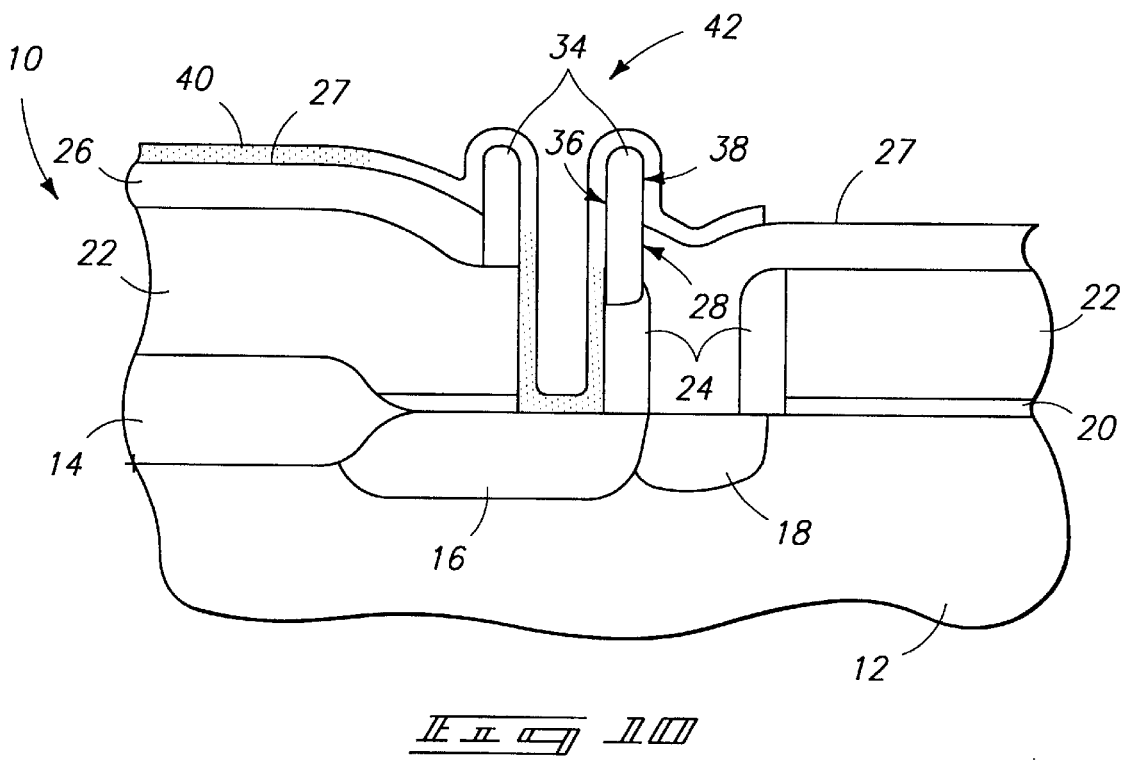
FIG. 10 is a view of the FIG. 1 wafer fragment at a processing step subsequent to that shown by FIG. 9.

FIG. 10 illustrates removal of layer 44 and subsequent patterning s of layer 40 into a desired shape. The result is the illustrated elongated resistor constituting a highly conformal semiconductive material layer which serpentines over first layer 26 outer surface 27, as well as over the pillar opposing vertical surfaces 36 and 38. Layer 40 is ultimately patterned as shown to define a resistor which comprises the illustrated container shape 42.

Although in the illustrated and preferred embodiment a container shaped resistor is produced, a singular, non-enclosed pillar might be produced to result in a non-container resistor.

Figure 11:
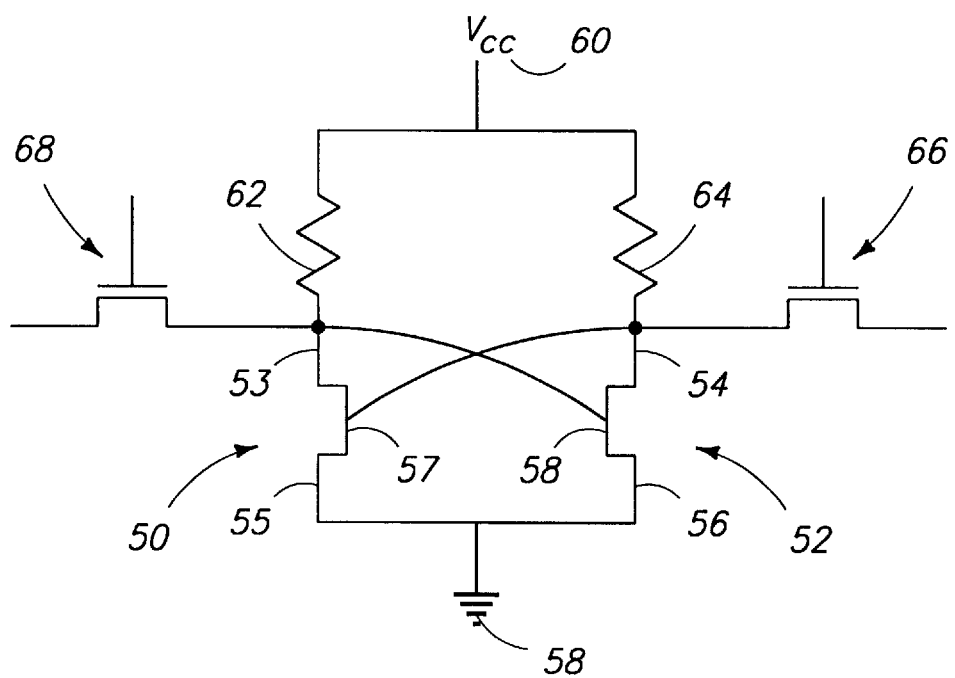
FIG. 11 is a schematic representation of SRAM circuitry in accordance with an aspect of the invention.

FIG. 11 schematically illustrates one example of an SRAM cell in accordance with the invention utilizing at least one of the subject resistors. Such comprises a pair of first and second pull-down transistors 50 and 52 respectively. These include respective drains 53, 54; respective sources 55, 56; and respective gates 57, 58. Gate 57 of first pull-down transistor 50 is electrically coupled to drain 54 of second pull-down transistor 52. Likewise, gate 58 of second pull-down transistor 52 is electrically coupled to drain 53 of first pull-down transistor 50. A ground node 58 and a Vcc node 60 are provided. A first resistor 62 and a second resistor 64 electrically couple with Vcc node 60. Drain 53 of first pull-down transistor 50 electrically couples with Vcc node 60 through first resistor 62. Drain 54 of second pull-down transistor 52 electrically couples through second resistor 64 to Vcc node 60. A pair of access transistors 66 and 68 are also provided.

In the context of the previous described construction, gate interconnect layer 22 constitutes a cross-coupling connection from one of the illustrated pull-down gates 57 or 58, which diffusion regions 16 and 18 constituting a drain and the source, respectively, from one pull-down transistor and one access transistor, respectively. At least one of first and second resistors 62, 64 preferably comprises one of the described container resistors, with both preferably comprising such resistor.

The illustrated construction provides an advantage over prior resistor constructions in extension or elongation of a resistor over previously formed elongated sidewalls.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of forming a resistor from semiconductive material comprising the following steps:

forming a circuit node to which electrical connection to a resistor is to be made;

forming a first electrically insulative material outwardly of the node;

forming an opening in the first electrically insulative material over the node, the opening having an opening width and sidewalls;

forming a second electrically insulative material outwardly of the first material and within the opening to a thickness which is less than one-half the opening width to less than completely fill the opening with second electrically insulative material, the first and second materials being selectively etchable relative to one another;

anisotropically etching the second material to form a substantially vertically extending sidewall spacer within the opening and to outwardly expose an upper surface of the first material adjacent the sidewall spacer, the sidewall spacer having an inner lateral surface and an outer lateral surface;

removing a portion of the first material to outwardly expose at least a portion of the sidewall spacer outer lateral surface;

providing a conformal layer of a semiconductive material over the exposed outer lateral sidewall spacer surface and over the inner lateral sidewall spacer surface within the opening to define a container shape of semiconductive material within the opening, the container shape making electrical connection with the circuit node; and patterning the conformal layer to define a resistor comprising the container shape.

2. The semiconductor processing method of forming a resistor of claim 1 wherein the step of forming the opening in the first electrically insulative material over the circuit node does not outwardly expose the circuit node prior to the formation of the second electrically insulative material.

3. The semiconductor processing method of forming a resistor of claim 1 wherein the first material comprises silicon dioxide and the second material comprises silicon nitride.

4. The semiconductor processing method of forming a resistor of claim 1 further comprising masking the container shape of the conformal layer while conductively doping unmasked portions of the conformal layer.

5. The semiconductor processing method of forming a resistor of claim 1 wherein the container shape includes an outer elevation portion and an inner elevation portion, the method further comprising conductively doping the inner elevation portion to a higher conductivity doping than the outer elevation portion.

6. The semiconductor processing method of forming a resistor of claim 1 wherein the first material comprises silicon dioxide and the second material comprises silicon nitride, and further comprising masking the container shape of the conformal layer while conductively doping unmasked portions of the conformal layer.

7. The semiconductor processing method of forming a resistor of claim 1 wherein the first material comprises silicon dioxide and the second material comprises silicon nitride, and the container shape includes an outer elevation portion and an inner elevation portion, the method further comprising conductively doping the inner elevation portion to a higher conductivity doping than the outer elevation portion.

8. The semiconductor processing method of forming a resistor of claim 1 further comprising masking the container shape of the conformal layer while conductively doping unmasked portions of the conformal layer, and wherein the container shape includes an outer elevation portion and an inner elevation portion, the method further comprising conductively doping the inner elevation portion to a higher conductivity doping than the outer elevation portion.

9. A semiconductor processing method of forming a resistor from semiconductive material comprising the following steps:

forming a first electrically insulative material outwardly of a circuit node;

forming an exposed vertical sidewall in the first electrically insulative material;

forming a second electrically insulative material outwardly of the first material and over the exposed first material vertical sidewall, the first and second materials being selectively etchable relative to one another;

removing a portion of the second material to form a substantially vertically extending sidewall spacer over the exposed first material vertical sidewall and to outwardly expose the first material adjacent the sidewall spacer, the spacer having an inner lateral surface and an outer lateral surface;

removing a portion of the first material to outwardly expose at least a portion of the spacer outer lateral surface; and forming a conformal layer of a semiconductive material over the exposed outer lateral spacer surface and over the inner lateral spacer surface, the conformal layer making electrical connection with the circuit node.

10. The semiconductor processing method of forming a resistor of claim 9 wherein the first material comprises silicon dioxide and the second material comprises silicon nitride.

11. The semiconductor processing method of forming a resistor of claim 9 further comprising providing the conformal layer to have different conductivity dopant concentrations at different locations.

12. The semiconductor processing method of forming a resistor of claim 9 wherein the first material comprises silicon dioxide and the second material comprises silicon nitride, and further comprising providing the conformal layer to have different conductivity dopant concentrations at different locations.

13. A semiconductor processing method of forming a resistor comprising the following steps:

forming an opening in a first electrically insulative material over a circuit node to which electrical connection is to be made;

forming a substantially vertically extending sidewall spacer within the opening, the sidewall spacer having an inner lateral surface and an outer lateral surface and comprising a second insulative material; and forming a layer of a semiconductive material over the sidewall spacer outer lateral surface and over the sidewall spacer inner lateral surface, the semiconductor material defining a resistor in electrical connection with the circuit node.

14. The method of claim 13 wherein the circuit node comprises an implant in a semiconductor substrate.

15. A semiconductor processing method of forming a resistor comprising the following steps:

forming an opening in a first electrically insulative material over a circuit node to which electrical connection is to be made;

forming a substantially vertically extending sidewall spacer within the opening, the sidewall spacer having an inner lateral surface and an outer lateral surface and comprising a second insulative material; and forming a layer of a semiconductive material over the sidewall spacer outer lateral surface and over the sidewall spacer inner lateral surface, the semiconductive material comprising a first region and a second region, the first region having a different conductivity doping than the second region, the semiconductive material defining a resistor in electrical connection with the node.

16. The method of claim 15 wherein the circuit node comprises an implant in a semiconductor substrate.

17. The method of claim 15 wherein one of the semiconductive material regions is doped by out diffusion from an adjacent semiconductive layer.

18. A semiconductor processing method of forming a resistor comprising the following steps:

forming a doped polysilicon layer over a circuit node;

forming a first electrically insulative material over the doped polysilicon layer;

forming a first opening in a first electrically insulative material over the circuit node, the first opening not extending to the circuit node;

forming a layer of a second electrically insulative material within the first opening;

forming a second opening through the layer of second electrically insulative material and through the first electrically insulative material to the circuit node;

forming a resistor layer within the second opening and in electrical contact with the circuit node; and out-diffusing dopant from the doped polysilicon layer into the resistor layer.

19. A semiconductor processing method of forming a resistor comprising the following steps:

forming a doped polysilicon layer over a circuit node;

forming an oxide layer over the doped polysilicon layer;

forming a first opening in the oxide layer over the circuit node, the first opening not extending to the circuit node;

forming a nitride layer within the first opening;

forming a second opening through the nitride layer and through the oxide layer to the circuit node;

forming a resistor layer within the second opening and in electrical contact with the circuit node; and out-diffusing dopant from the doped polysilicon layer into the resistor.

* * * * *

UNITED STATES PATENT AND TRADEMARK OFFICE
CERTIFICATE OF CORRECTION

PATENT NO.   : 5,770,496

DATED        : June 23, 1998

INVENTOR(S)  : Martin Ceredig Roberts

It is certified that error appears in the above-identified patent and that said Letters Patent is ereby corrected as shown below:

Col. 4, line 44:   Delete "is" after "higher".

Col. 4, line 61:   Delete "s" after "patterning".

Signed and Sealed this

Twenty-fifth Day of August, 1998

Attest:

BRUCE LEHMAN

*Attesting Officer*     *Commissioner of Patents and Trademarks*